United States Patent
Yamaguchi et al.

(10) Patent No.: US 12,049,177 B2
(45) Date of Patent: Jul. 30, 2024

(54) DOOR WIRING MODULE AND METHOD OF MANUFACTURING DOOR WIRING MODULE

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Koji Yamaguchi, Mie (JP); Hiroki Hirai, Mie (JP); Makoto Higashikozono, Mie (JP); Housei Mizuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 380 days.

(21) Appl. No.: 17/427,445

(22) PCT Filed: Jan. 20, 2020

(86) PCT No.: PCT/JP2020/001673
§ 371 (c)(1),
(2) Date: Jul. 30, 2021

(87) PCT Pub. No.: WO2020/162147
PCT Pub. Date: Aug. 13, 2020

(65) Prior Publication Data
US 2022/0134973 A1 May 5, 2022

(30) Foreign Application Priority Data
Feb. 8, 2019 (JP) .................... 2019-021185

(51) Int. Cl.
*B60R 16/02* (2006.01)
*B60R 13/02* (2006.01)
(Continued)

(52) U.S. Cl.
CPC ...... *B60R 16/0215* (2013.01); *B60R 13/0243* (2013.01); *B60R 13/08* (2013.01); *H03G 3/30* (2013.01)

(58) Field of Classification Search
CPC . B60R 16/0215; B60R 13/0243; B60R 13/08; B60R 16/00; B60R 16/02;
(Continued)

(56) References Cited

U.S. PATENT DOCUMENTS

| 6,000,959 A | 12/1999 | Curtindale et al. |
| 2003/0218279 A1 | 11/2003 | Kisu et al. |
| 2021/0009050 A1* | 1/2021 | Enomoto ......... H01B 13/01209 |

FOREIGN PATENT DOCUMENTS

| JP | 59-114720 | 8/1984 |
| JP | 63-130353 | 8/1988 |

(Continued)

OTHER PUBLICATIONS

WO-2019187334-A1 computer translation (Year: 2019).*
(Continued)

*Primary Examiner* — Amy R Weisberg
*Assistant Examiner* — Melissa Ann Bonifazi
(74) *Attorney, Agent, or Firm* — GREENBLUM & BERNSTEIN, P.L.C.

(57) ABSTRACT

A door wiring module includes: a door planar member incorporated into a door panel of a vehicle; a wiring member disposed on a main surface of the door planar member; and a holding member covering the main surface of the door planar member and the wiring member and directly joined to at least the main surface of the door planar member to hold (Continued)

the wiring member in a state of being disposed on the main surface of the door planar member.

5 Claims, 5 Drawing Sheets

(51) Int. Cl.
  *B60R 13/08* (2006.01)
  *H02G 3/30* (2006.01)
  *H03G 3/30* (2006.01)

(58) Field of Classification Search
  CPC .... B60J 5/00; H02G 3/30; H02G 3/00; H02G 3/02; H02G 3/04; H02G 3/22; H02G 3/24; H02G 3/36
  USPC .................. 296/146.7; 174/650, 72 A, 68.1
  See application file for complete search history.

(56) References Cited

FOREIGN PATENT DOCUMENTS

| JP | 01-105327 U | 7/1989 | |
|---|---|---|---|
| JP | 05-46608 U | 6/1993 | |
| JP | 8-2348 | 1/1996 | |
| JP | 09-23540 | 1/1997 | |
| JP | 11-198742 | 7/1999 | |
| JP | 2000-90746 | 3/2000 | |
| JP | 2001-513721 | 9/2001 | |
| JP | 2004-1381 | 1/2004 | |
| JP | 2014-88165 | 5/2014 | |
| JP | 2015-71333 | 4/2015 | |
| JP | 2016-171032 | 9/2016 | |
| WO | WO-2019187334 A1 * | 10/2019 | ............ B60J 5/0413 |

OTHER PUBLICATIONS

International Search Report issued in International Patent Application No. PCT/JP2020/001673, dated Mar. 10, 2020, along with an English translation thereof.
U.S. Appl. No. 17/426,452 to Koji Yamaguchi et al., filed Jul. 28, 2021.
Japan Office Action issued in Japan Patent Application No. 2019-21185, dated Apr. 5, 2022, together with an English translation thereof.

* cited by examiner

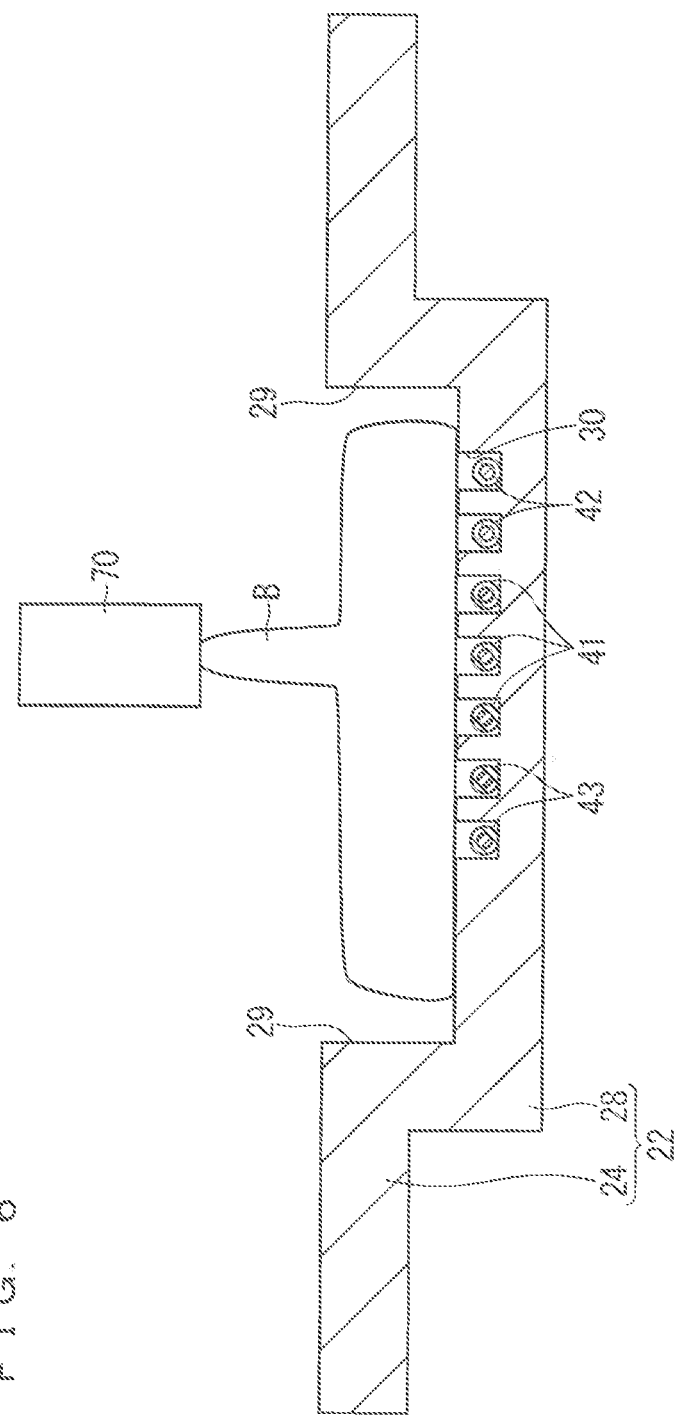
F I G. 6

DOOR WIRING MODULE AND METHOD OF MANUFACTURING DOOR WIRING MODULE

TECHNICAL FIELD

The present disclosure relates to a door wiring module and a method of manufacturing a door wiring module.

BACKGROUND ART

Patent Document 1 discloses a technique of assembling a door wire harness to a door. In Patent Document 1, a door trim to which a wire harness is attached is assembled to a door panel.

PRIOR ART DOCUMENTS

Patent Documents

Patent Document 1: Japanese Patent Application Laid-Open No. 11-198742

SUMMARY

Problem to be Solved by the Invention

In Patent Document 1, a band attached to the door harness is fixed to a trim panel with a screw, thus the door harness is attached to the door trim.

An object is to provide a novel technique for attaching a door wiring member to a door planar member.

Means to Solve the Problem

A door wiring module according to the present disclosure is a door wiring module including: a door planar member incorporated into a door panel of a vehicle; a wiring member disposed on a main surface of the door planar member; and a holding member covering the main surface of the door planar member and the wiring member and directly joined to at least the main surface of the door planar member to hold the wiring member in a state of being disposed on the main surface of the door planar member.

Effects of the Invention

According to the present disclosure, a novel technique for attaching a door wiring member to a door planar member can be provided.

BRIEF DESCRIPTION OF DRAWINGS

FIG. 6 is an explanation view illustrating a method of manufacturing the door wiring module according to the embodiment.

DESCRIPTION OF EMBODIMENT(S)

Description of Embodiment of Present Disclosure

Figure 1:
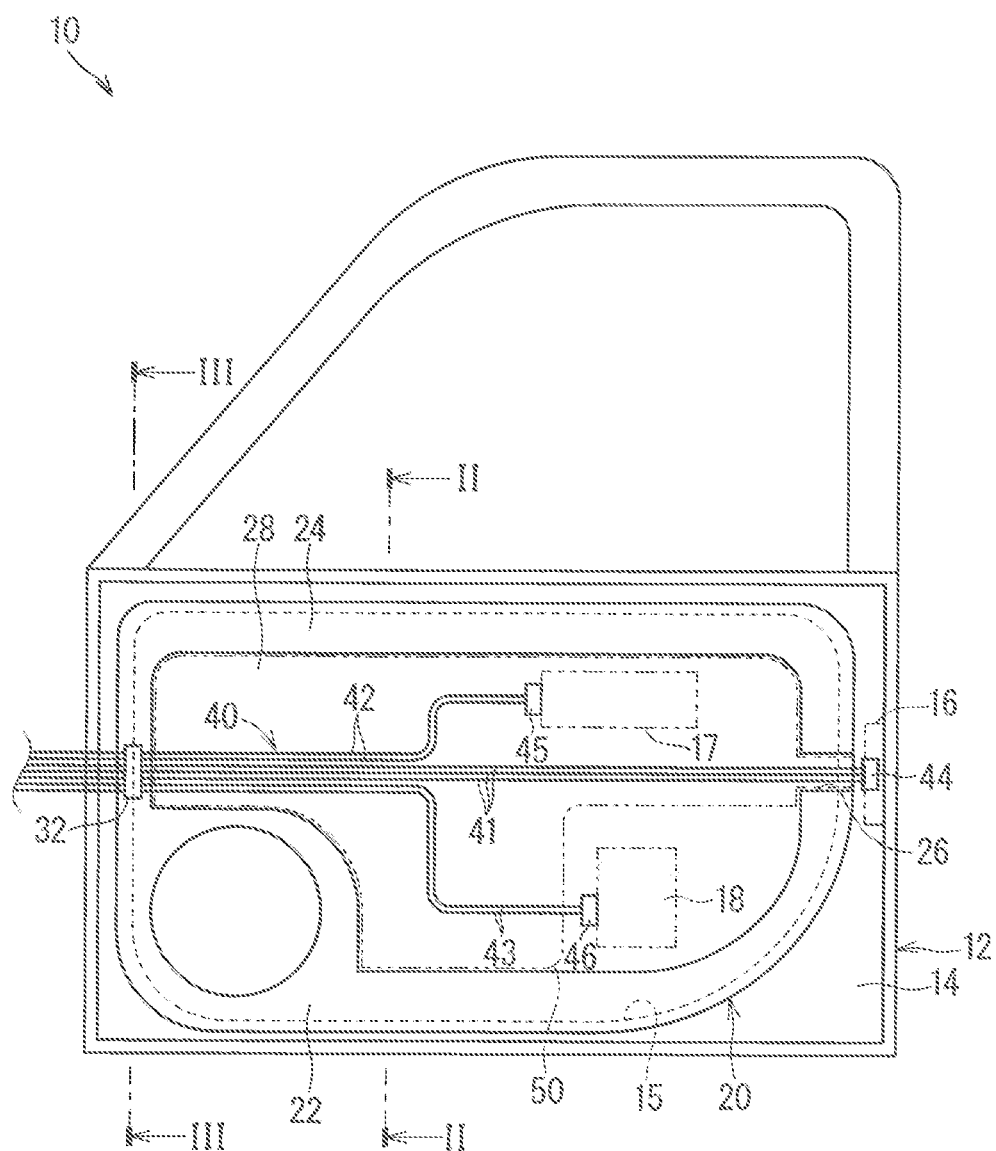
FIG. 1 is a schematic side view illustrating a door into which a door wiring module is incorporated according to an embodiment.

Embodiments of the present disclosure are listed and described firstly.

A door wiring module and a method of manufacturing a door wiring module according to the present disclosure are as follows.

(1) A door wiring module includes: a door planar member incorporated into a door panel of a vehicle; a wiring member disposed on a main surface of the door planar member; and a holding member covering the main surface of the door planar member and the wiring member and directly joined to at least the main surface of the door planar member to hold the wiring member in a state of being disposed on the main surface of the door planar member.

The wiring member can be attached to the door planar member by the holding member directly joined to the door planar member. A novel technique for attaching a door wiring member to a door planar member can be provided.

Herein, the door planar member is a planar member having a dimension in a thickness direction smaller than a dimension in a planar direction.

(2) The wiring member is preferably housed in a holding groove formed in the main surface of the door planar member. The reason is that the holding member can prevent the wiring member from coming out of the holding groove.

(3) It is sufficient that the wiring member includes a plurality of electrical wires, the plurality of holding grooves are formed in a parallel state in the door planar member, and the electrical wires are housed one by one in the holding groove. The reason is that the electrical wires can be held in a parallel state. Moreover, a thickness of the holding member can be reduced.

(4) It is sufficient that the door planar member includes a wall part partitioning a region where the holding member is provided, and an outer edge of the holding member has contact with the wall part. The reason is that a leakage of resin can be suppressed when the resin is injected to form the holding member.

(5) It is sufficient that the holding member is formed of a foam resin as a material and does double duty as a soundproof member. The reason is that a member fixing the wiring member and a soundproof member need not be provided separately.

(6) It is sufficient that the holding member wholly covers at least a part of the main surface where the wiring member is disposed. The reason is that the wiring member disposed on the main surface can be held over a whole length.

(7) A method of manufacturing a door wiring module according to the present disclosure is a method of manufacturing a door wiring module including: a step (a) arranging a wiring member on a main surface of a door planar member incorporated into a door panel of a vehicle; and a step (b) of, after the step (a), injecting a softened resin material on the main surface of the door planar member and the wiring member to directly join the resin material to at least the main surface. The injected resin is directly joined to the door planar member, thus the wiring member can be attached to the door planar member. A novel technique for attaching a door wiring member to a door planar member can be provided.

[Details of Embodiment of Present Disclosure]

Specific examples of a door wiring module and a method of manufacturing the door wiring module of the present disclosure are described hereinafter with reference to the drawings. The present invention is not limited to these examples, but is indicated by claims, and it is intended that meanings equivalent to claims and all modifications within a scope of claims are included.

EMBODIMENT

Figure 2:
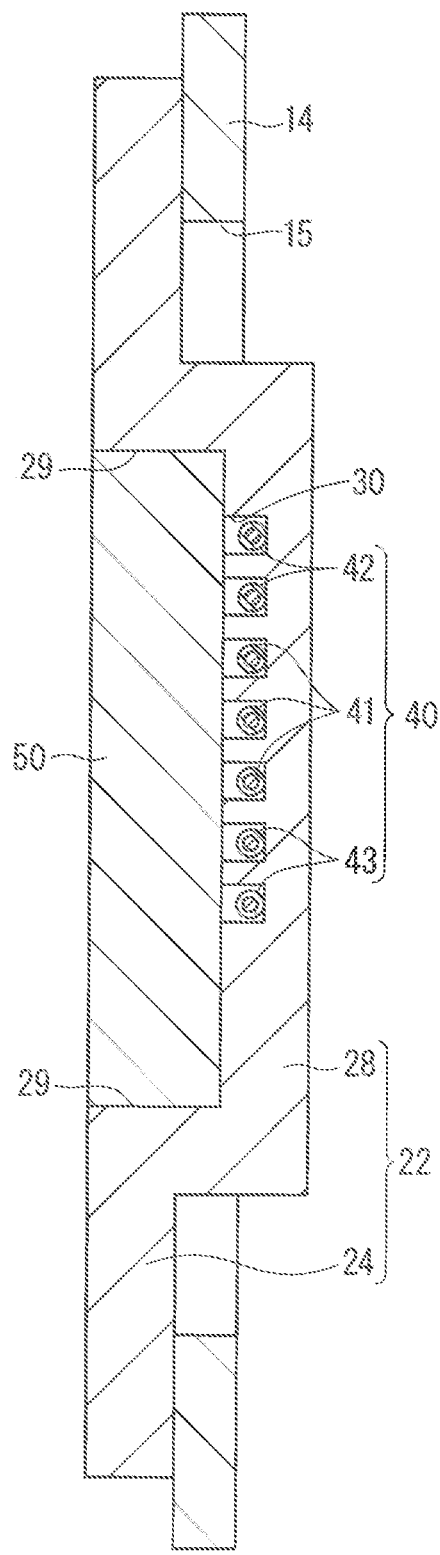
FIG. 2 is a cross-sectional view of the door wiring module cut along a II-II line in FIG. 1.
Figure 3:
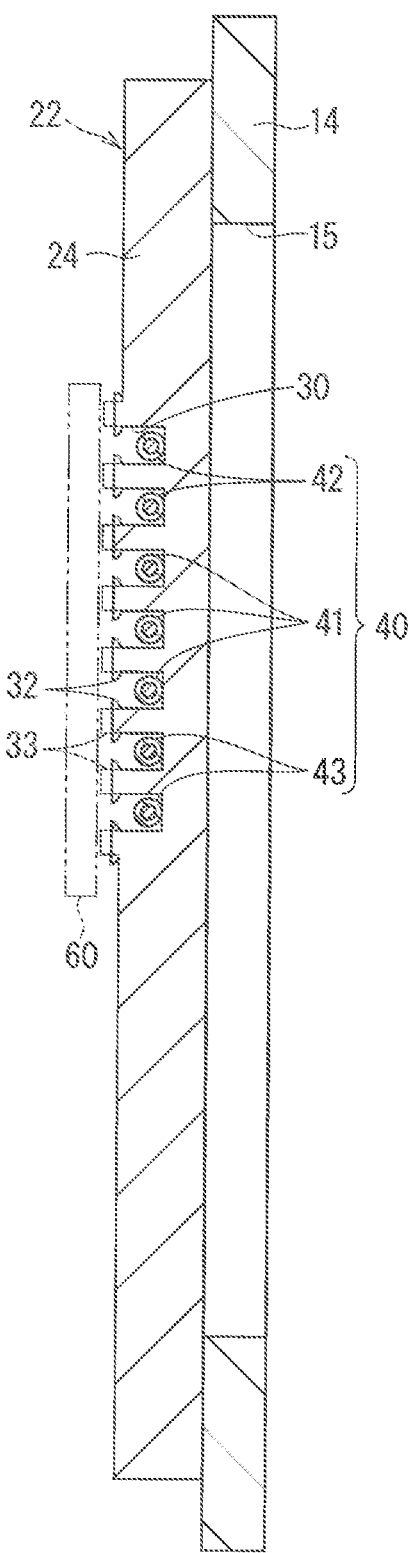
FIG. 3 is a cross-sectional view of the door wiring module cut along a III-III line in FIG. 1.
Figure 4:
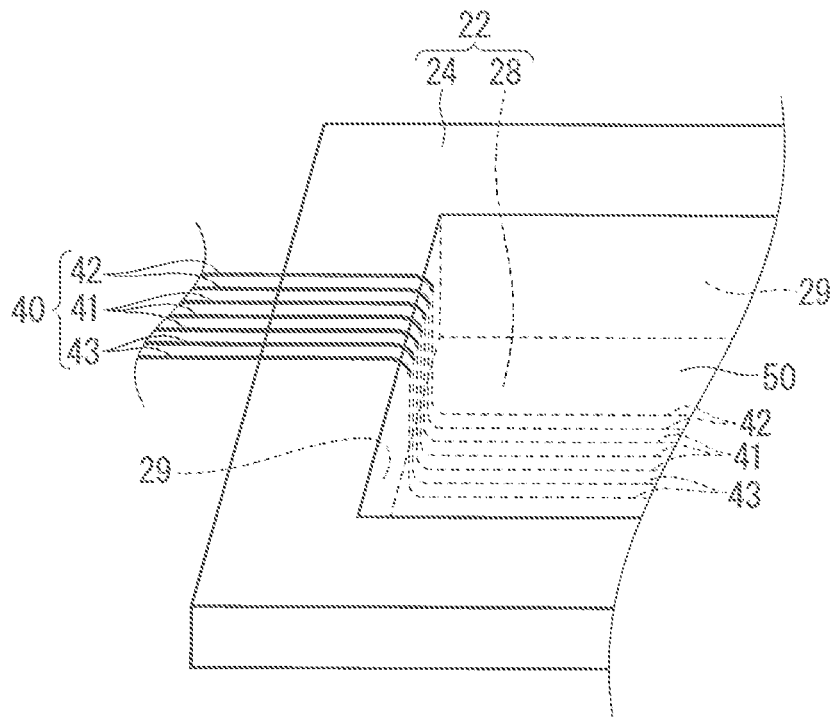
FIG. 4 is a schematic perspective view illustrating a part of the wiring member extending to an outer side from a door planar member.
Figure 5:
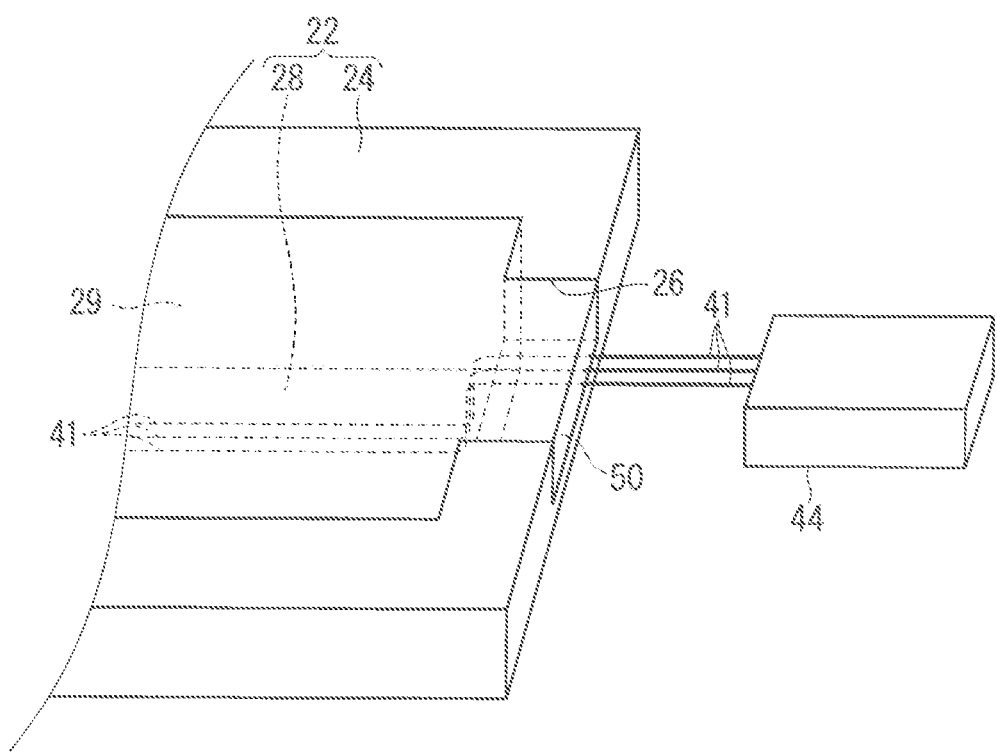
FIG. 5 is a schematic perspective view illustrating a part of the wiring member extending to the outer side from the door planar member.

A door wiring module and a method of manufacturing the door wiring module according to an embodiment are described hereinafter. FIG. 1 is a schematic side view illustrating a door 10 into which a door wiring module 20 is incorporated according to the embodiment. FIG. 2 is a cross-sectional view of the door wiring module cut along a II-II line in FIG. 1. FIG. 3 is a cross-sectional view of the door wiring module cut along a III-III line in FIG. 1. FIG. 4 is a schematic perspective view illustrating a part of a wiring member 40 extending to an outer side from a door planar member 22. FIG. 5 is a schematic perspective view illustrating a part of the wiring member 40 extending to the outer side from the door planar member 22. FIG. 6 is an explanation view illustrating a method of manufacturing the door wiring module 20 according to the embodiment. In FIG. 1, a holding member 50 covering the wiring member 40 is illustrated by a dashed-two dotted line.

The door 10 is formed into a flat shape as a whole, and is a part openable and closable to partition an inner side and outer side of a vehicle. The door 10 is assumed to be a driver side door, a passenger's side door, and a rear seat door, for example. The door 10 includes a door panel 12 and the door wiring module 20.

The door panel 12 includes an outer panel (not shown) and an inner panel 14. The outer panel is provided in a part of the door 10 facing the outer side of the vehicle to constitute an appearance of the vehicle together with a body. The inner panel 14 is provided on a vehicle interior side of the outer panel. A space for housing a window is normally formed between the inner panel 14 and the outer panel. A window exposed to a rainwater environment is housed in the space, and a slit-like opening through which the window goes in and out is formed on an upper side of the space. Thus, the space is a space which water may enter. The space is a space which may be connected to an outer space, thus is also a space which a wind noise, for example, may enter from outside. In the meanwhile, an opening 15 is provided in the inner panel 14 to access the space at a time of manufacturing and maintaining the door 10, for example. The opening 15 is preferably closed at a time of normal use of the vehicle, for example. Thus, the door wiring module 20 is attached to close the opening 15.

The door wiring module 20 includes the door planar member 22, the wiring member 40, and the holding member 50. The wiring member 40 is held in the door planar member 22 by the holding member 50. The door planar member 22 is incorporated into the door 10, thus the wiring member 40 is also incorporated into the door 10.

In the present example, the door planar member 22 is a member incorporated between the door panel 12 and a design trim (not shown) in the door 10 of the vehicle. The door planar member 22 is not particularly limited as long as it is a member incorporated between the door panel 12 and the design trim in the door 10 of the vehicle, but various planar members can be used. In the description hereinafter, the door planar member 22 is an inner trim.

The door 10 in the present example further includes a design trim. The design trim is a part provided in a part of the door 10 facing the inner side of the vehicle to constitute the interior of the vehicle. A door handle and an operation part of an in-vehicle apparatus, for example, are attached to the design trim.

The door planar member 22 is provided as a member for completely partitioning a vehicle interior space and an outer space with the inner panel 14. The door planar member 22 is a planar member. The planar member herein indicates a member having a thickness dimension smaller than a dimension in a planar direction (two directions perpendicular to a thickness direction) and two-dimensionally spread. It needs not necessarily be flat in a front-back direction (the thickness direction), but a convex-concave portion may occur in the front-back direction.

The door planar member 22 includes a main plate 24 and a housing space forming part 28. The door planar member 22 is assembled to the inner panel 14 by a screw clamp or a locking structure in a state of being located in a predetermined position covering the opening 15 of the inner panel 14.

The main plate 24 is a plate-like part with a sufficient size for covering the opening 15. A speaker incorporating hole 25 for incorporating a speaker is formed in the main plate 24. It is not necessary to form the speaker incorporating hole 25 in the door planar member 22. For example, also applicable is a configuration that a speaker incorporating hole is formed in the inner panel 14 and the door planar member 22 is incorporated into a region except for a part where a speaker is incorporated into the inner panel 14. The housing space forming part 28 is opened on a side of one main surface (a side of the vehicle interior) of the main plate 24, and is formed into a container shape protruding to a side of the other main surface (outside) of the main plate 24. The housing space forming part 28 is formed into a container shape smaller than the opening 15. The door planar member 22 is fitted into the opening 15 of the inner panel 14, and the housing space forming part 28 is provided on an inner side of the opening 15. The main plate 24 covers a part between an opening edge portion of the housing space forming part 28 and a peripheral edge portion of the opening 15. For example, when a part of a peripheral edge portion of the main plate 24 overlapping with the inner panel 14 is screwed to the inner panel 14 using a screw, for example, a gap therebetween can be practically covered.

Some or all of electrical components 16, 17, and 18 incorporated into the door 10 can be assembled to the housing space forming part 28 of the door planar member 22, for example. Herein, the electrical components 17 and 19 are incorporated therein. The electrical components 17 and 18 are assumed to be a motor opening and closing the window, an actuator for locking and unlocking the door 10, and various switches, for example.

A holding groove 30 in which the wiring member 40 is housed is formed on a main surface of the door planar member 22. The holding groove 30 holds at least a part of the wiring member 40 along an extension direction. The wiring member 40 is housed in and held by the holding groove 40, thereby being wired on and held by the door planar member 22. The holding groove 30 is formed in accordance with a wiring state of the wiring member 40. The holding groove 30 is formed in both the main plate 24 and the housing space forming part 28 herein, however, there may also be a case where the holding groove 30 is formed only in the main plate 24 or a case where the holding groove 30 is formed only in the housing space forming part 28. The holding groove 30 is formed to be equal to or larger than the electrical wires 41, 42, and 43. Thus, a whole periphery of the electrical wires 41, 42, and 43 is housed in the holding groove 30. However, the holding groove 30 may be formed smaller than the electrical wires 41, 42, and 43. In this case, parts of the electrical wires 41, 42, and 43 may protrude from an opening part of the holding groove 30.

It is sufficient that the door planar member 22 has rigidity to be hardly bended in a front-back direction. Accordingly, when the door planar member 22 is assembled to the door panel 12, an edge part thereof is hardly bended, thus the door planar member 22 is easily kept in a spread shape, and can be easily assembled. For example, the door planar member 22 is formed to have higher rigidity than the holding member 50. The door planar member 22 is a member in which resin or metal, for example, as a material is molded. The door planar member 22 may be molded by pouring a molten material into a mold or by performing a press molding on a planar material using a mold.

The wiring member 40 is an electrical wire provided in the door 10 and connected to the electrical components 16, 17, and 18 incorporated into the door 10. The wiring member 40 of the door 10 is generally connected to the vehicle at a hinge side of the door 10, and branches off on a route from a front side to a back side of the door 10 to be connected to various electrical components 16, 17, and 18. Herein, the wiring member 40 includes a plurality of electrical wires 41, 42, and 43. A covering wire having a core wire made up of a conductor with a covering around the core wire can be used as the electrical wires 41, 42, and 43. The core wire may be a single core wire or a stranded wire.

Herein, the plurality of electrical wires 41, 42, and 43 are collected in a parallel state on each one end side. It is assumed that one end portions of the plurality of electrical wires 41, 42, and 43 extend from the door 10 from a hinge side thereof in a bundle, led to an inner side of a vehicle body, and connected to the other connector in the vehicle body via a common connector, for example. The electrical wire 41 extends longer than the electrical wires 42 and 43, and the electrical wires 42 and 43 branch off in middle portions of the electrical wires 41 in the extension direction. Connectors 44, 45, and 46 are attached to the other end portions of the electrical wires 41, 42, and 43, respectively. The electrical wires 41, 42, and 43 are connected to the electrical components 16, 17, and 18 via the connectors 44, 45, and 46, for example.

The electrical wires 41, 42, and 43 are individually held in the plurality of holding grooves 30. Herein, the plurality of holding grooves 30 are formed so that the number and a parallel state thereof correspond to the plurality of electrical wires 41, 42, and 43. The holding groove 30 also branches off in accordance with the branching of the electrical wires 41, 42, and 43.

More specifically, the electrical wire 41 is held along a predetermined route from a middle portion of a front edge portion of the main plate 24 in an up-down direction to a middle portion of a back edge portion of the main plate 24 in the up-down direction via a main surface on a front side of the main plate 24, a main surface of a bottom of the housing space forming part 28, and a main surface on a back side of the main plate 24. The electrical wire 42 is held along a predetermined route on an upper side of the electrical wire 41 from the middle portion of the front edge portion of the main plate 24 in the up-down direction to the main surface of the bottom of the housing space forming part 28 via the main surface on the front side of the main plate 24. The electrical wire 43 is held along a predetermined route on a lower side of the electrical wire 41 from the middle portion of the front edge portion of the main plate 24 in the up-down direction to the main surface of the bottom of the housing space forming part 28 via the main surface on the front side of the main plate 24.

The electrical wire 41 extends from a back end portion of the door planar member 22 to be connected to the electrical component 16. The electrical component 16 is a component incorporated into a back part of the door 10, and assumed is a door lock-unlock motor, for example. The electrical wires 42 and 43 branch from the electrical wire 41 in the housing space forming part 28, and are connected to the electrical components 17 and 18 in the housing space forming part 28. The electrical wire 42 and the electrical wire 43 branch at the same position in the middle portion of the electrical wire 41 in the extension direction, but may branch at different positions.

In the present embodiment, the plurality of electrical wires 41, 42, and 43 are individually housed in the holding grooves 30, however, all the plurality of electrical wires 41, 42, and 43 may be housed and held in a common holding groove. It is also applicable that the plurality of electrical wires 41, 42, and 43 are divided into a plurality of groups, the holding grooves in number corresponding to the plurality of groups are formed, and the plurality of electrical wires 41, 42, and 43 are housed and held in the plurality of holding grooves for each of the plurality of groups.

The holding member 50 is a member holding the wiring member 40 in a state of being disposed on the main surface of the door planar member 22. The holding member 50 is formed to cover the main surface of the door planar member 22 and the wiring member 40 and to be directly joined to at least the main surface of the door planar member 22. The state of being directly joined herein indicates a state of being directly attached without an inclusion such as an adhesive agent. The holding member 50 and the electrical wires 41, 42, and 43 may or may not have contact with each other. The direct joining may be performed on a portion where the holding member 50 and the electrical wires 41, 42, and 43 have contact with each other.

A direct joining is performed on a whole portion where the holding member 50 and the door planar member 22 have contact with each other. The holding member 50 is formed of a foam resin such as urethane foam, for example, as a material. The holding member 50 may be formed of resin which is not a foam resin (referred to as a non-foam resin) as a material, for example. The holding member 50 may be made up of a single layer of the same material or may be a plurality of layers.

The holding member 50 does double duty as a soundproof member. The soundproof member is a member for reducing sound. The soundproof member may have a function as an acoustic material, or may also have a function as a sound insulating material. The acoustic material has a space when seeing a cross section in a thickness direction. The acoustic material absorbs sound energy which has entered, for example, thereby reducing a reflection of sound as much as possible. When the holding member 50 is formed of a foam resin such as urethane foam, for example, as a material, the holding member 50 can double as an acoustic material. The sound insulating material does not have a space when seeing a cross section in a thickness direction. The sound insulating material absorbs or reflects the sound energy, thereby cutting sound as much as possible, for example. When the holding member 50 is formed of resin which is not a foam resin (referred to as a non-form resin) as a material, the holding member 50 can double as a sound insulating material. The holding member 50 may have a double-layered structure made up of a layer of a foam resin as a material and a layer of a non-foam resin as a material to have both a function as an acoustic material and a function as a sound insulating material.

The holding member 50 covers the whole portion of the main surface of the door planar member 22 where at least the wiring member 40 is disposed. The whole portion herein indicates that the whole portion of the main surface of the door planar member 22 where at least a middle portion of the wiring member 40 is disposed. In the example illustrated in FIG. 1, the holding member 50 covers the whole portion of the main surface of the door planar member 22 where at least the wiring member 40 is disposed except for the end portion of the wiring member 40 and a portion of the wiring member 40 located in an edge portion of the door planar member 22. However, the region covering the wiring member 40 may be appropriately set as long as the holding member 50 can hold the wiring member 40, thus it is also applicable to cover a partial portion.

The holding member 50 is provided in the housing space forming part 28 in the door planar member 22. The door planar member 22 includes a wall part 29 partitioning a region where the holding member 50 is provided. Herein, a part of the door planar member 22 constituting an inner surface of the housing space forming part 28 is the wall part 29 partitioning a region where the holding member 50 is provided. At least a part of an outer edge of the holding member 50 has contact with the wall part 29. At least a part of a peripheral edge part of the holding member 50 extends along the wall part 29. However, the wall part 29 needs not be formed in the door planar member 22. The outer edge part of the holding member 50 needs not reach the wall part 29.

The electrical component 17 attached on the door planar member 22 is covered by the holding member 50. As described above, the electrical components 17 and 18 attached on the door planar member 22 may include the electrical component 17 covered by the holding member 50. For example, the electrical component 17 connected to the electrical wire 42 prior to the formation of the holding member 50 may be covered by the holding member 50. The electrical component 18 attached on the door planar member 22 is not covered by the holding member 50. As described above, the electrical components 17 and 18 attached on the door planar member 22 may include the electrical component 18 which is not covered by the holding member 50. For example, it is sufficient that the electrical component 18 connected to the electrical wire 43 after the formation of the holding member 50 is not covered by the holding member 50. Needless to say, the electrical component connected to the electrical wire prior to the formation of the holding member needs not be covered by the holding member. When the electrical components attached on the door planar member 22 include the electrical component 18 which is not covered by the holding member 50, the electrical component 18 which is not covered by the holding member 50 can be in the state of not being covered by the holding member 50 by partitioning the holding member 50 by a mold, for example, so that resin does not enter an area around the holding member 50 at the time of forming the holding member 50. All or none of the electrical components attached on the door planar member 22 may be covered by the holding member 50, or the electrical component covered by the holding member 50 and the electrical component which is not covered by the holding member 50 may be attached thereon together.

Herein, the holding member 50 is formed to cover the opening part of the holding groove 30 on a side opposite to a bottom thereof to prevent the electrical wires 41, 42, and 43 from coming out of the holding groove 30. The holding member 50 may be or may not be located in the holding groove 30. When the holding member 50 is located in the holding groove 30, the holding member 50 may fill the whole holding groove 30 from the opening part to the bottom part thereof, or may also fill only a part of a side of the opening part. When the holding member 50 fills only the part of the side of the opening part, the holding member 50 may or may not reach the electrical wires 41, 42, and 43.

The holding member 50 may hold a part of the electrical wires 41, 42, and 43 which is not housed in the holding groove 30. When the holding member 50 holds the electrical wires 41, 42, and 43 located on a flat surface of the door planar member 22, it is sufficient that a thickness of a layer of the holding member 50 directly joined to the door planar member 22 in the part of the holding member 50 directly joined to the door planar member 22 is larger than a thickness of each of the electrical wires 41, 42, and 43.

The electrical wires 41, 42, and 43 extending from the holding member 50 are located on an outer edge of the holding member 50. One end portions of the electrical wires 41, 42, and 43 are parts extending toward the door hinge. One end portions of the electrical wires 41, 42, and 43 extend to an outer side from a front edge portion of the door planar member 22. The other end portion of the electrical wire 41 is connected to the electrical component 16 which is not provided in the door planar member 22 in the door 10. The other end portion of the electrical wire 41 extends to an outer side from a back edge portion of the door planar member 22. The other end portion of the electrical wire 43 extends from the holding member 50 in an inner part of the wall part 29. For example, the other end portion of the electrical wire 43 is connected to the electrical component 10 after the formation of the holding member 50, thus the other end portion of the electrical wire 43 extends from the holding member 50.

A thickness dimension of the holding member 50 is not particularly limited, however, any thickness dimension is applicable as long as the holding member 50 can hold the wiring member 40. When the holding member 50 does double duty as a soundproof member, a soundproof performance is increased by increasing the thickness dimension of the holding member 50. In the example illustrated in FIG. 2, the thickness dimension of the holding member 50 is the same as a depth dimension of the housing space forming part 28 (a height dimension of the wall part 29). Needless to say, the thickness dimension of the holding member 50 may be smaller or larger than the depth dimension of the housing space forming part 28 (the height dimension of the wall part 29). The holding member 50 may be formed to protrude to the same extent as a part of the main surface of the door planar member 22 protruding to an outermost side or protrude less than the part thereof. The reason is that increase in the thickness dimension of the door wiring module 20 can be suppressed.

When there is a part extending from the housing space forming part 28 to the main plate 24 such as the one end portions of the electrical wires 41, 42, and 43 and the other end portion of the electrical wire 41, it is also applicable that an inclined surface inclined more gently from the main surface of the bottom of the housing space forming part 28 to the main surface of the main plate 24 than a vertical surface is formed and the electrical wires are disposed on this portion. An extension part 26 concaved more than a surrounding portion may be located in a part of the main plate 24 where the electrical wires 41, 42, and 43 extend to an outer side. The extension part 26 may be or may not be covered by the holding member 50.

The part of the electrical wires 41, 42, and 43 which is not held by the holding member 50 on the main surface of the door planar member 22 may be or may not be held by the other holding part. For example, a retaining part 32 is formed as a holding part holding the electrical wires 41, 42, and 43 housed in the holding groove 30 in the example illustrated in FIG. 3. The retaining part 32 is a part formed to narrow or close the opening 15 to prevent the electrical wires 41, 42, and 43 from coming out of the opening 15. The retaining part 32 is a part formed by crushing a protruding part 33 formed to protrude to a side opposite to the bottom of the holding groove 30 on an peripheral edge part of the opening part on a side opposite to the bottom thereof. A heating member 60 is pressed against the protruding part 33, and melted by heat and crushed, for example.

<Manufacturing Method>

A method of manufacturing a door wiring module 20 described above is described. The method of manufacturing the door wiring module 20 includes a step (a) and a step (b) described hereinafter.

The step (a) is a step of arranging the wiring member 40 on the main surface of the door planar member 22 incorporated into the door panel 12 of a vehicle. Accordingly, the wiring member 40 can be in a desired wiring state. The step (b) is a step of, after the step (a), injecting a softened resin material B on the main surface of the door planar member 22 and the wiring member 40 to directly join the resin material B to at least the main surface of the door planar member 22. In the step (b), the resin material B is hardened in a state of being directly joined to the main surface of the door planar member 22 to become the holding member 50, thereby holding the wiring member 40 on the main surface of the door planar member 22.

With regard to the step (a), the wiring member 40 is disposed on the main plate 24 of the door planar member 22 and the main surface of the housing space forming part 28 herein. At this time, the wiring member 40 is disposed along the holding groove 30 formed in the door planar member 22. The wiring member 40 is housed and held in the holding groove 30, thereby being kept in a predetermined wiring state.

With regard to the step (b), the resin material B has contact with the main surface of the door planar member 22 in a softened state after being injected from an injection inlet 70, for example. The resin material B is a material having contact with the main surface of the door planar member 22 in the softened state, thereby being able to be directly joined to the main surface of the door planar member 22. Herein, a foam resin is used as the resin material B, thus the holding member 50 can do double duty as a soundproof member.

An area around the injection region is partitioned by the wall part 29 and a mold, for example, at the time of injecting the resin material B. Accordingly, suppressed is the injection of the resin material B into a portion where the resin material B is not desired to be injected. A part of the resin material B reaching the wall part 29 and the mold, for example, constitutes an outer edge part of the holding member 50. The part of the resin material B reaching the wall part 29 is directly joined to the wall part 29. When the resin material B has a high viscosity, for example, there may be a case where the resin material B does not enter the holding groove 30. When the resin material B has a low viscosity, for example, there may be a case where the resin material B enters the holding groove 30.

In a state where the resin material B is injected in a predetermined amount, a surface part thereof (a surface on a side opposite to a side having contact with the main surface of the door planar member 22) may be or may not be smoothened. When the resin material B is smoothened, a surface part of the holding member 50 can be flattened. There may be a mold covering an upper part of the injection region, around which is partitioned by the wall part 29 and a mold, for example. In this case, the surface part of the holding member 50 may be formed into a shape corresponding to an inner surface shape of the mold covering the upper part.

Accordingly to the present disclosure, the wiring member 40 can be attached to the door planar member 22 by the holding member 50 directly joined to the door planar member 22. A novel technique for attaching the wiring member 40 for the door 10 to the planar member for the door 10 can be provided.

The holding groove 30 in which the electrical wires 41, 42, and 43 are formed, and the holding member 50 covers the holding groove 30, thus the holding member 50 can prevent the wiring member 40 from coming out of the groove. The plurality of holding grooves 30 are formed, thus the electrical wires 41, 42, and 43 can be held in a parallel state. The protrusion of the electrical wires 41, 42, and 43 from the holding groove 30 is suppressed, and the thickness of the holding member 50 can be reduced.

The door planar member 22 includes the wall part 29 partitioning the region where the holding member 50 is provided, and the outer edge of the holding member 50 has contact with the wall part 29, thus the leakage of the resin material B at the time of injecting the resin material B and forming the holding member 50 can be suppressed.

The holding member 50 is formed of a foam resin as a material and does double duty as a soundproof member, thus a member fixing the wiring member 40 and a soundproof member need not be provided separately.

The holding member 50 wholly covers the part of the main surface where at least the wiring member 40 is disposed, thus the wiring member 40 disposed on the main surface can be held over a whole length.

ADDITIONAL STATEMENT

Described in the embodiment is the example that the door planar member 22 in the door wiring module 20 is the inner trim, however, this configuration is not necessary. It is sufficient that the door planar member in the door wiring module 20 is a planar member assembled to the door 10, and may be a design trim, for example.

The holding groove 30 needs not be formed in the door planar member 22. In this case, the electrical wires 41, 42, and 43 may be wired to overlap with each other on the door planar member 22, or may also be wired side by side so as not to overlap with each other.

Each configuration described in the embodiment and each modification example can be appropriately combined as long as they are not contradictory.

EXPLANATION OF REFERENCE SIGNS

10 door
12 door panel
14 inner panel
15 opening 16, 17, 18 electrical component
20 door wiring module
22 door planar member
24 main plate
25 speaker incorporating hole
26 extension part
28 housing space forming part
29 wall part
30 holding groove
32 retaining part
33 protruding part
40 wiring member
41, 42, 43 electrical wiring
44, 45, 46 connector
50 holding member
60 heating member
70 injection inlet
B resin material

The invention claimed is:

1. A door wiring module, comprising:
a door planar member incorporated between a door panel and a design trim in a vehicle;
a wiring member disposed on a main surface of the door planar member; and
a holding member covering the main surface of the door planar member and the wiring member and directly joined to at least the main surface of the door planar member to hold the wiring member in a state of being disposed on the main surface of the door planar member, wherein
the wiring member is housed in at least one holding groove formed in the main surface of the door planar member,
the wiring member includes a plurality of electrical wires,
the at least one holding groove includes a plurality of holding grooves formed in a parallel state in the door planar member,
the electrical wires are housed one by one in the holding grooves,
the holding member is made up of hardened resin which has been injected on the main surface, and includes a part provided over the plurality of holding grooves in the main surface to cover opening parts of the plurality of holding grooves.

2. The door wiring module according to claim 1, wherein
the door planar member includes a wall part partitioning a region where the holding member is provided, and
an outer edge of the holding member has contact with the wall part.

3. The door wiring module according to claim 1, wherein
the holding member is formed of a foam resin as a material and does double duty as a soundproof member.

4. The door wiring module according to claim 1, wherein
the holding member wholly covers at least a part of the main surface where the wiring member is disposed.

5. A method of manufacturing a door wiring module, comprising:
arranging a wiring member on a main surface of a door planar member incorporated between a door panel and a design trim in a vehicle; and
after the arranging, injecting a softened resin material on the main surface of the door planar member and the wiring member to directly join the resin material to at least the main surface, wherein
a plurality of holding grooves in which a plurality of electrical wires can be housed one by one in the wiring member are formed in the main surface of the door planar member,
the arranging includes housing the plurality of electrical wires in the plurality of holding grooves, and
the injecting includes injecting a resin material in a region over the plurality of holding grooves in the main surface.

\* \* \* \* \*